United States Patent
Smentek et al.

(10) Patent No.: US 7,400,866 B2
(45) Date of Patent: Jul. 15, 2008

(54) METHODS AND APPARATUS FOR CALIBRATING AND CONTROLLING OUTPUT POWER LEVELS IN A BROADBAND COMMUNICATION SYSTEM

(75) Inventors: David J. Smentek, Addison, IL (US); Ronald E. Wilson, Kildeer, IL (US)

(73) Assignee: General Instrument Corporation, Horsham, PA (US)

(*) Notice: Subject to any disclaimer, the term of this patent is extended or adjusted under 35 U.S.C. 154(b) by 466 days.

(21) Appl. No.: 11/036,467

(22) Filed: Jan. 14, 2005

(65) Prior Publication Data

US 2006/0160506 A1    Jul. 20, 2006

(51) Int. Cl.
*H04B 17/00* (2006.01)
*H01Q 11/12* (2006.01)

(52) U.S. Cl. ............ 455/115.1; 455/127.1; 455/127.2; 455/126

(58) Field of Classification Search ................ 455/126, 455/127.1–127.4, 115.1, 67.11, 249.1, 250.1; 330/129, 149
See application file for complete search history.

(56) References Cited

U.S. PATENT DOCUMENTS

| | | | | |
|---|---|---|---|---|
| 4,553,105 A * | 11/1985 | Sasaki | ......................... | 330/145 |
| 5,313,658 A * | 5/1994 | Nakamura | ..................... | 455/69 |
| 5,515,008 A * | 5/1996 | Ueda et al. | .................. | 330/280 |
| 5,752,171 A * | 5/1998 | Akiya | ......................... | 455/126 |
| 6,256,483 B1 * | 7/2001 | Moerder et al. | ............ | 455/115.1 |
| 6,418,301 B1 * | 7/2002 | Le et al. | ........................ | 455/73 |
| 6,661,284 B1 * | 12/2003 | Luz et al. | ................. | 330/124 R |
| 6,795,712 B1 * | 9/2004 | Vakilian et al. | .............. | 455/522 |
| 7,106,805 B2 * | 9/2006 | Atkinson et al. | ............ | 375/295 |
| 7,236,745 B2 * | 6/2007 | Wells et al. | ............... | 455/67.11 |
| 2004/0242170 A1 * | 12/2004 | Gilbert | ..................... | 455/127.1 |

* cited by examiner

*Primary Examiner*—Duc M. Nguyen
(74) *Attorney, Agent, or Firm*—Larry T. Cullen

(57) ABSTRACT

The present invention provides methods and apparatus for calibrating and controlling output power levels in a broadband communication system. The power level of an intermediate frequency (IF) signal may be varied at a first attenuator. The IF signal from the first attenuator may be frequency converted at a mixer to provide a desired transmit frequency converted signal. The power level of the frequency converted signal may be adjusted at a second attenuator. The signal may be sampled after the second attenuator in order to detect its output power level. The detected output power level may be compared with a reference level to obtain a difference signal. The difference signal may be used in a feedback loop to adjust the power level of the signal output from the first attenuator so that a constant output power level is maintained. Methods and apparatus for calibrating output power levels are also provided.

17 Claims, 6 Drawing Sheets

METHODS AND APPARATUS FOR CALIBRATING AND CONTROLLING OUTPUT POWER LEVELS IN A BROADBAND COMMUNICATION SYSTEM

BACKGROUND OF THE INVENTION

The present invention relates to the field of broadband communications. More specifically, the present invention relates to methods and apparatus for calibrating and controlling power output levels in a broadband communication system.

Hybrid fiber coaxial (HFC) networks are used by cable companies to provide services such as analog and/or digital video, video on demand, data communications, and telephony services to the home. These networks utilize a headend system, often referred to as a cable router or CMTS (cable modem termination system), to send information through an RF link from the cable plant to the end user. The HFC network requires that the cable router be capable of operating over a broad range of downstream frequencies, such as 50-860 MHz, and a wide range of output power levels, such as +48 to +61 dBmV.

These requirements present a challenge in the design of the cable router upconverter. The upconverter is the RF interface between the cable router and the HFC network. The HFC network relies on the upconverter to handle an absolute output power accuracy of +/−1 dB over the specified operating range. This accuracy and stability is required to properly set up the multi-channel network. If set incorrectly, the upconverter could disrupt the quality of cable services offered to the end user. It is difficult to calibrate and maintain this output power accuracy over a broadband or multi-octave range of operating frequencies.

At one frequency or a narrow band of frequencies, calibrating and setting output power is a fairly common task. Completing this task over a broadband range of frequencies with the required accuracy is more difficult. Calibration times get longer, more memory space is required to store calibration values, and the upconverter gain response over frequency must be taken into consideration.

For example, a common way to calibrate and set output power is via a brute force method. At factory calibration the upconverter is set to a desired frequency of operation and the gain of the upconverter is adjusted until desired output level is obtained. This gain setting is then stored in a lookup table and can be recalled at a later time. This method is acceptable for a narrow band of frequencies and power levels. As the number of frequencies increase, the upconverter calibration time increases, which tends to slow down factory output. The increased number of gain settings that need to be stored also increases the need for more memory space on the product. The number of points for calibration and storage grow as various output power levels at a wider range of frequencies are required. The matrix of calibration points versus output level versus frequency can get quite large while trying to maintain the required absolute accuracy at the upconverter output.

Improvements to this prior art calibration method include adding more sophisticated circuits to improve performance. For example, a power detector can be used near the output of the upconverter to convert RF power to a dc voltage. This dc voltage can then be used in software or hardware closed control loop to set the output power level at the appropriate level. While this can solve the problem of maintaining and setting the output power level at a discrete or narrow band of frequencies, it does not work as well in a wideband application as the frequency response of the upconverter and the sensitivity of the detector will vary with frequency of operation.

In addition, once the upconverter has been calibrated (e.g., at the factory or in the field), the accuracy of the output power level of the upconverter must be maintained or controlled during operation. There are many prior art approaches for maintaining accuracy of the output power level of the upconverter. For example, an open loop power control circuit may be used. Such open loop circuits suffer from significant temperature drift when using an analog attenuator or require a broadband digital attenuator with step size equal to that of the transmitter output power step size. This greatly reduces the candidate parts available which meet the desired power output resolution and all other specification requirements over a large frequency range. Further, analog or continuous attenuators typically have a nonlinear attenuation versus control signal response making them difficult to represent for calibration over the power level range of the transmitter.

In addition, channel filtering is not possible in broadband RF circuits due to the channel linearity requirements and the number of channels that have to be realized. Switched filtering may be used to bandpass filter the selected output frequency. However, there will always be a range of unfiltered frequencies around the carrier. The output carrier-to-noise ratio (C/N) for such a transmitter will be determined by the input level to the frequency tuned mixer (upconverter).

FIG. 1 shows a prior art example of open loop control of output power levels at an intermediate frequency (IF) using an analog or digital attenuator 10 before the frequency tuned mixer/upconverter 12. The attenuator 10 is used to vary the power level of an IF signal input into the mixer 12. The attenuation of the device as the RF signal passes through it can be varied by either an analog (dc voltage) or digital (bits) means. The mixer 12 is used to frequency convert the broadband signal. Output of the mixer will be various combinations of the input signals as is known in the art. A low noise amplifier (LNA) 14 is used to increase the power level of the broadband signal while adding a minimal amount of noise degradation. A power amplifier (PA) 16 is used to increase power level of an RF/microwave signal. The maximum capable output power level achieved with a power amplifier is usually higher than that of a normal amplifier or LNA.

With the example shown in FIG. 1, the attenuator 10 attenuates the input signal to mixer 12, thereby reducing C/N when adjusting power output level down from maximum level. An analog attenuator usually exhibits a nonlinear response over frequency and output level range. This nonlinear response increases calibration time. Further, analog attenuators are difficult to temperature compensate. A digital attenuator is required to have the same output resolution as the transmitter output.

FIG. 2 shows a prior art example of open loop control at a radio frequency (RF) using an analog or digital attenuator 10 after the mixer 12. As discussed above in connection with FIG. 1, an analog attenuator exhibits nonlinear response over frequency and output level range and is difficult to calibrate. Further, analog attenuators are difficult to temperature compensate over frequency. A digital attenuator needs to have the same step size as the required level adjust and must operate over the entire frequency range of operation.

FIG. 3 illustrates a prior art embodiment of open loop control at both IF and RF having a first analog or digital attenuator 10 before the frequency tuned mixer 12 and a second analog or digital attenuator 10 after the frequency tuned mixer. Such a system suffers from the same disadvantages as discussed above in connection with the prior art systems shown in FIGS. 1 and 2, but can be used to divide the adjustment range between two circuits.

FIG. 4 illustrates a prior art closed loop system for RF power control. A feedback loop is provided from a directional coupler 18 to an analog attenuator 10' which is positioned after the frequency tuned mixer. The directional coupler 18 is used to couple or sample the broadband signal with limited degradation to the main signal path. A detector 20 in the feedback loop detects the power level of the signal and converts it into a dc voltage. A comparator 22 takes the dc voltage from the detector 20 and a reference dc voltage from a digital to analog converter (DAC) 24 as inputs and outputs their difference. The difference value is used to control the second (analog) attenuator 10'. This system requires an analog attenuator 10' after the mixer 12 that operates over the entire frequency range. This system does not allow for a digital attenuator to be used in a continuous control loop, since a digital attenuator can only be used to make adjustments in discrete step sizes (e.g., 1 dB, 2 dB, etc.). Therefore, a digital attenuator will not follow continuous power changes (e.g., a 0.25 dB of change per minute as heating occurs). Further, such a system requires many frequency band calibrations to obtain required output level accuracy.

It would be advantageous to provide methods and apparatus for optimal control of the output power level of a broadband signal to a high degree of accuracy, while at the same time providing an optimal topology to maintain the output carrier-to-noise ratio of the transmitter.

It would be further advantageous to provide methods and apparatus for accurately calibrating or setting the output power of transmitter in a broadband communication system for any required frequency and output level in a simple manner that requires minimal effort.

The methods and apparatus of the present invention provide the foregoing and other advantages.

SUMMARY OF THE INVENTION

The present invention relates to methods and apparatus for calibrating and controlling output power levels of a broadband signal in a broadband communication system.

In an example embodiment of the present invention, methods and apparatus for calibrating a transmitter and setting output power levels of a broadband signal in a broadband communications system are provided.

In an example embodiment of the invention, a method for calibrating a transmitter and setting output power levels of a broadband signal in a broadband communications system is provided. A variable gain device, which varies a power level of the broadband signal output from the transmitter, is set at two known setpoints. A corresponding output power level from the transmitter is measured at each setpoint. A slope (SLP) of the detector based on the measured output power level at each setpoint can then be determined. A predefined gain band may be selected as a reference gain band. A power level at a frequency point inside the selected reference gain band can then be measured. The variable gain device can then be adjusted until a desired reference output power level (DRPL) of the selected reference gain band is achieved. A setpoint of the variable gain device at which DRPL is achieved in the selected reference gain band (REFVGD) can then be determined. A desired operating output power level (OPL) for the transmitter in a desired gain band of operation can then be determined based on frequency of operation, REFVGD, and the slope of the detector (SLP). The variable gain device may then be adjusted to provide the desired OPL.

In a further example embodiment of the present invention, a method for controlling output power levels in a broadband communication system is provided. The power level of an intermediate frequency (IF) signal may be varied at a first attenuator. The IF signal from the first attenuator may be frequency converted at a mixer to provide a desired transmit frequency converted signal. The power level of the frequency converted signal may be adjusted at a second attenuator. The signal output may be sampled after the second attenuator in the main broadband signal path, so that the output power level of the signal can be detected. The detected output power level can then be compared with a reference level to obtain a difference signal. The difference signal can then be used in a feedback loop to adjust the power level of the signal output from the first attenuator so that a constant output power level can be maintained.

The present invention also encompasses apparatus for carrying out the foregoing methods.

BRIEF DESCRIPTION OF THE DRAWINGS

The present invention will hereinafter be described in conjunction with the appended drawing figures, wherein like reference numerals denote like elements, and.

DETAILED DESCRIPTION

The ensuing detailed description provides exemplary embodiments only, and is not intended to limit the scope, applicability, or configuration of the invention. Rather, the ensuing detailed description of the exemplary embodiments will provide those skilled in the art with an enabling description for implementing an embodiment of the invention. It should be understood that various changes may be made in the function and arrangement of elements without departing from the spirit and scope of the invention as set forth in the appended claims.

The present invention relates to methods and apparatus for calibrating and controlling output power levels of a broadband signal in a broadband communication system. In an example embodiment of the present invention, methods and apparatus for calibrating a transmitter and setting output power levels of a broadband signal in a broadband communications system are provided. The broadband signal may comprise one of an RF signal or microwave signal.

A broadband or multi-octave upconverter operating in a system requiring absolute output power accuracy and agility would require a large amount of calibration time using a conventional brute force type of method. The present invention resolves this problem by using a quick and simple calibration procedure, thus eliminating the need for many discrete measurements and calibration points. Output power accuracy and agility is a critical customer requirement in the highly competitive cable infrastructure business. It is one of the first parameters or figures of merit measured by customers as they look to purchase and install new equipment into their networks. This invention enables this important customer requirement to be met, without the added costs of lengthy factory test times.

Figure 1:
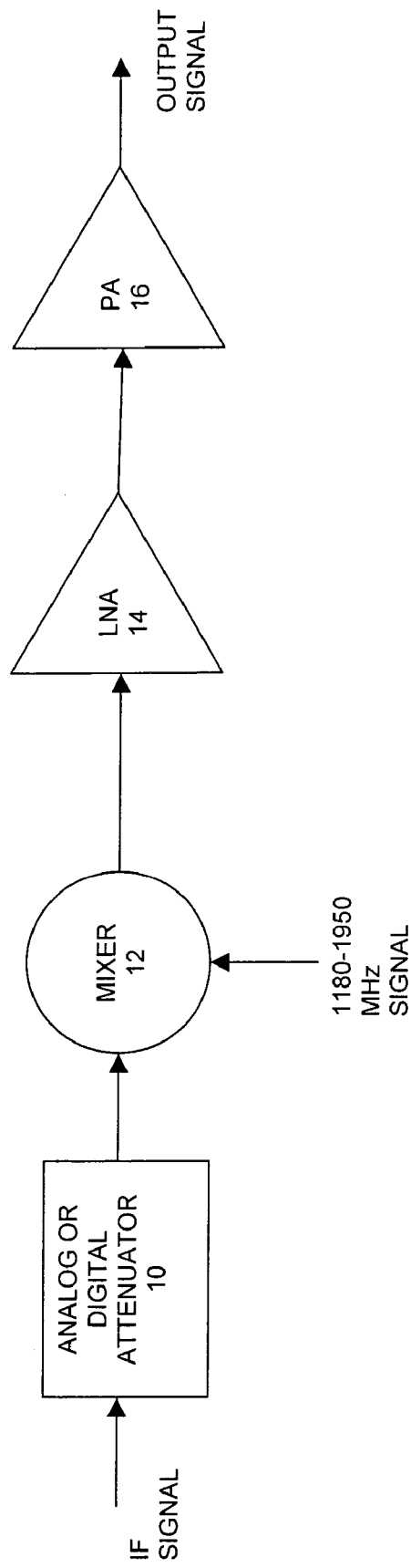
FIG. 1 is a block diagram illustrating a first prior art example of open loop power control.
Figure 2:
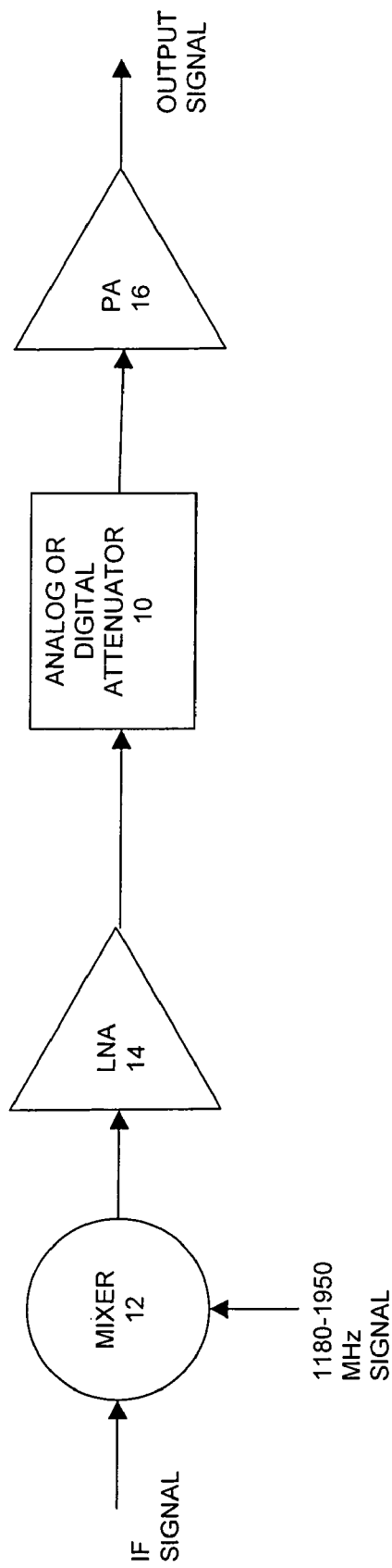
FIG. 2 is a block diagram illustrating a second prior art example of open loop power control.
Figure 3:
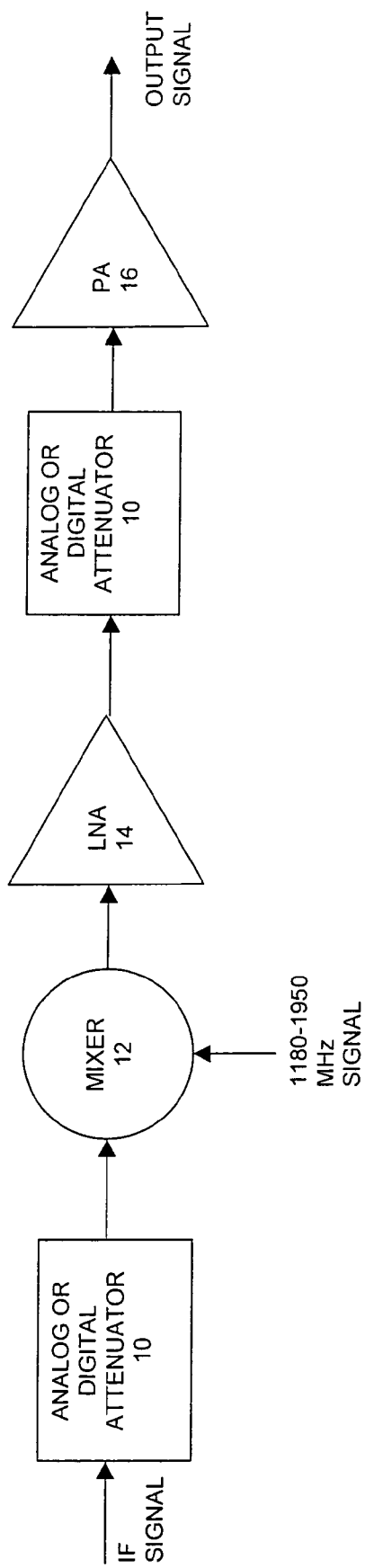
FIG. 3 is a block diagram illustrating a third prior art example of open loop power control.
Figure 4:
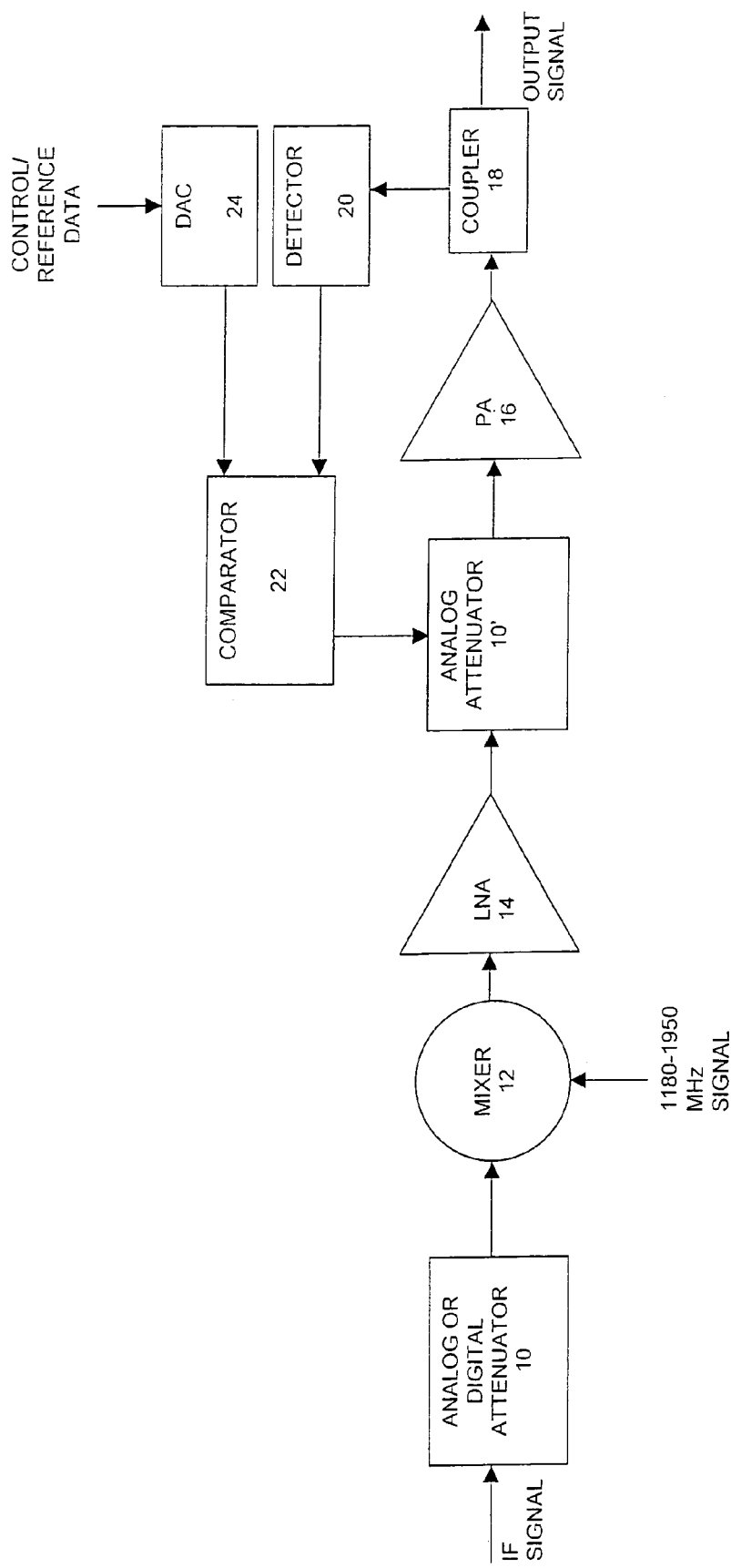
FIG. 4 is a block diagram illustrating a prior art example of closed loop power control.
Figure 5:
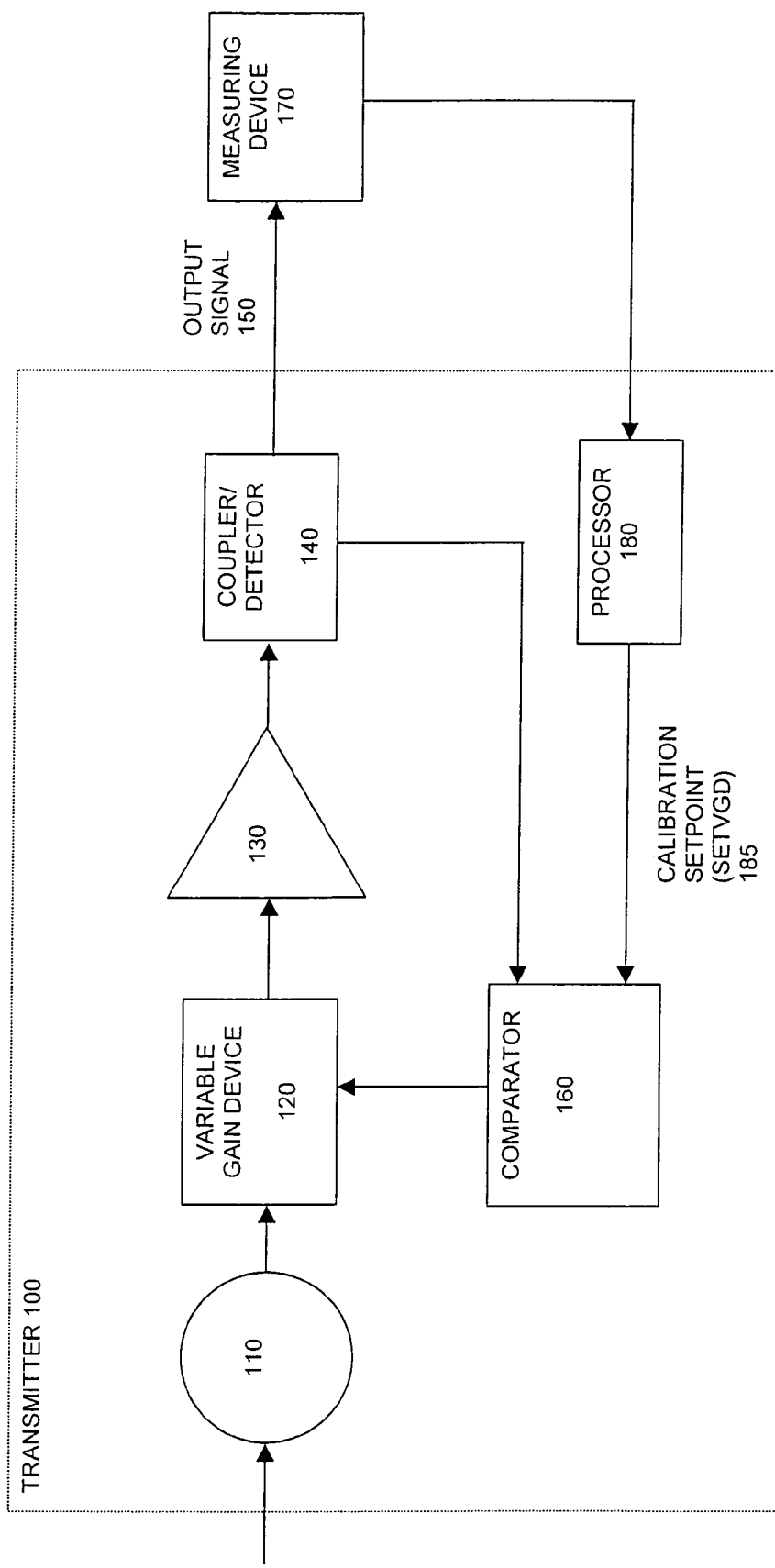
FIG. 5 is a block diagram illustrating an example embodiment of an apparatus used for calibration of a transmitter in accordance with the present invention.

As shown in FIG. 5, in an example embodiment of the invention, the transmitter 100 includes an upconverter 110 (also referred to herein as a frequency mixer) for frequency converting an input intermediate frequency (IF) signal. A variable gain device 120 is provided for varying the power level of the broadband signal 150 output from the transmitter 100. The variable gain device 120 may comprise an analog attenuator, a digital attenuator, or an analog/digital variable gain amplifier.

An amplifier 130 for increasing the output power level of the signal 150 may be provided. A coupler/detector 140 may be provided for sampling the signal 150 from the main signal path in order to detect its output power level. Those skilled in the art will appreciate that although the coupler and detector are shown as part of the same device in FIG. 5, the coupler may be implemented separately from the detector. The detector portion of the detector/coupler 140 may comprise a linear power detector.

The response of the transmitter 100 may be characterized over frequency to determine where gain breakpoints or gain bands occur. A gain band is defined as a specified range of frequencies where the gain delta from lowest specified frequency to highest specified frequency is at a desirable level to meet system requirements. In a broadband or multi-octave design, gain will tend to roll off as frequency increases.

In an example embodiment of the inventive calibration procedure, the variable gain device 120 is set at two known setpoints. A corresponding output power level of the output signal 150 from the transmitter 100 is measured at each setpoint (e.g., by measuring device 170 external to the transmitter 100). A slope (SLP) of the detector 140 can then be calculated (e.g., at processor 180) based on the measured output power level at each setpoint. For example, the slope of the detector may be calculated as follows:

SLP=(A−B)/(X−Y), wherein A and B represent the respective output power at the setpoints X and Y, where A and B are in units of dBm and X and Y are in units decimal DAC (digital to analog converter) steps.

A predefined gain band can then be selected for use as a reference gain band during the calibration procedure. All other gain bands in the transmitter may then be defined relative to the reference gain band. A power level of the signal at a frequency point inside the selected reference gain band can then be measured by measuring device 170. The variable gain device 120 can then be adjusted (e.g., via processor 180 controlling the comparator 160) until a desired reference output power level (DRPL) of the selected reference gain band is achieved. A setpoint of the variable gain device 120 at which DRPL is achieved in the selected reference gain band (REFVGD) may then be determined by the processor 180.

The processor 180 may then determine a desired operating output power level (OPL) for the transmitter 100 in a desired gain band of operation based on frequency of operation, REFVGD, and the slope of the detector (SLP). The variable gain device 120 can then be adjusted to provide the desired OPL.

DRPL may comprise a maximum operating power output level of the selected reference gain band. However, other desired values may be used as reference level.

The calibration procedure may further include determining a setpoint of the variable gain device 120 for maximum power in the desired operating gain band MAXOPBANDVGD based on REFVGD. The desired OPL may be based on MAXOPBANDVGD.

For example, MAXOPBANDVGD may be determined based on the desired gain band of operation, REFVGD, and the slope of the detector (SLP). In particular,

MAXOPBANDVGD=REFVGD+(REFDELTA/SLP), where REFDELTA is equal to the difference in gain between the desired operating gain band and the selected reference gain band.

Adjusting of the variable gain device 120 to provide the OPL by the processor 180 may be accomplished by determining (e.g., at processor 180) a setpoint of the variable gain device at the desired OPL of the transmitter (SETVGD 185), and setting the variable gain device 120 at SETVGD 185. The setpoint SETVGD may be determined as follows:

SETVGD=MAXOPBANDVGD−[(DRPL−OPL)/(SLP)].

SETVGD 185 may be provided from the processor 180 to the comparator 160 and used by the comparator 160 in a closed loop to set and maintain the desired power output level of the output signal 150.

Figure 6:
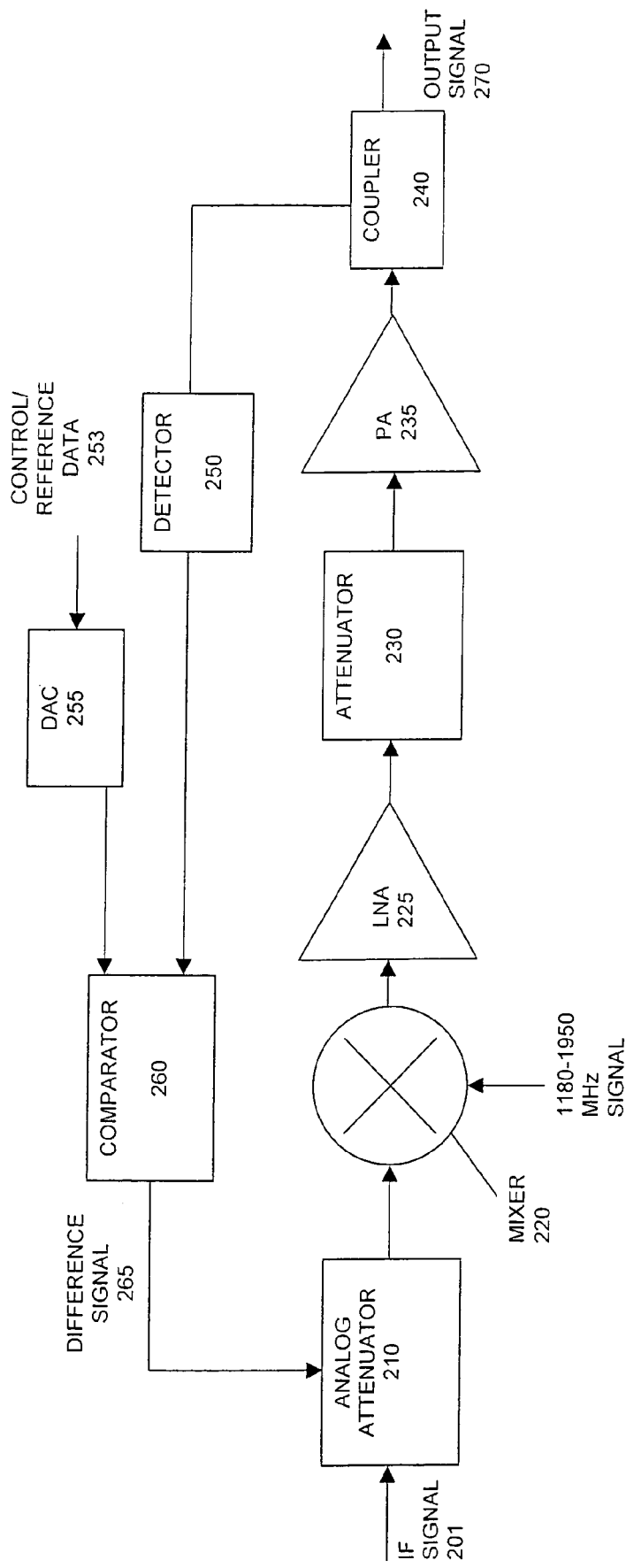
FIG. 6 is a block diagram illustrating an example embodiment of a closed loop power control circuit in accordance with the present invention.

In addition to the calibration procedures discussed above, the present invention also encompasses methods and apparatus for controlling output power levels in a broadband communication system. In accordance with an example embodiment of the invention as shown in FIG. 6, a transmitter 200 may include a first attenuator 210 for varying the power level of an intermediate frequency (IF) input signal 201. The IF input signal 201 may be, for example, a 1090 Mhz signal. A mixer (upconverter) 220 may be used to frequency convert the IF signal from the first attenuator 210 to provide a desired frequency converted transmit signal. For example, a 1090 MHz IF signal may be mixed with a signal within the approximately 1180-1950 Mhz range in order to achieve an output signal 270 in the range of 90-860 MHz.

A second attenuator 230 may be provided for adjusting the power level of the frequency converted signal from the mixer 220. Sampling means (e.g., coupler 240) may be provided for sampling the signal output after the second attenuator 230 in the main broadband signal path. Although the sampling means is shown in FIG. 6 as coupler 240, those skilled in the sampling function may be carried out using a splitter, a detector built into an amplifier (e.g., amplifier 235), or the like.

A detector 250 may be provided for detecting an output power level of the signal from the sampled signal. The detector 250 may comprise a log linear power detector. A comparator 260 is provided for comparing the detected output power level with a reference level (e.g., control/reference data 253) to obtain a difference signal 265. The difference signal 265 may then be provided to the first attenuator 210 in a feedback loop in order to adjust the power level of the signal output from the first attenuator 210. In this manner, a constant output power level of the output signal 270 may be maintained.

The reference level input to the comparator 260 may be provided in a number of ways. For example, the reference level input to the comparator 260 may be provided by a digital-to-analog converter (DAC) 255, which may receive data control/reference data 253 from a calibration procedure such as that described above in connection with FIG. 5. For example, the control/reference data 253 may comprise SETVGD 185 shown in FIG. 5.

The power level of the signal output from the mixer 220 may be increased at a first amplifier 225, which may comprise a low noise amplifier (LNA). The power level of the signal output from the second attenuator 230 may be increased at a second amplifier 235.

In a further example embodiment, the first attenuator 210 may comprise a fixed frequency analog attenuator. The second attenuator 230 may comprise one of a digital or analog attenuator. The second attenuator 230 is used as the coarse or main tuning device to adjust the output power level, leaving the first attenuator 210 as a fine tune device. This provides minimal change on the input power level to the mixer 220, which helps maintain a constant carrier-to-noise ratio.

Fixed frequency attenuators are easier to design and more readily available than broadband attenuators. Broadband attenuators are usually digital or have discrete attenuation steps. Using a fixed frequency attenuator before the mixer 220 allows the post mixer, noise compensating attenuator (attenuator 230) to be either analog or digital. A digital attenuator is not restricted to the transmitter output resolution, thus increasing the number of candidate parts. The post mixer attenuator 230 can now be thought of as a coarse adjust and the pre-mixer attenuator 210 as a fine level adjust for setting desired output power. The log linear power detector 250 reduces the nonlinear calibration of an analog attenuator to a linear power detector slope and intercept calibration. The calibration is only required at one level setting and some number of frequencies that captures the transmitter frequency response. With the present invention, temperature stability is enhanced versus prior art open loop configurations, as the log linear power detector 250 is much more stable than an analog attenuator. The invention improves broadband power control accuracy over frequency, output level, and temperature and does so while maintaining optimal C/N performance of the transmitter.

It should be appreciated that foregoing methods and apparatus for controlling output power levels discussed in connection with FIG. 6 may be implemented after the calibration procedures described above in connection with FIG. 5, or independently of these calibration procedures.

It should now be appreciated that the present invention provides advantageous methods and apparatus for calibrating and controlling output power levels in a broadband communication system.

Although the invention has been described in connection with various illustrated embodiments, numerous modifications and adaptations may be made thereto without departing from the spirit and scope of the invention as set forth in the claims.

What is claimed is:

1. A method for calibrating a transmitter and setting output power levels of a broadband signal in a broadband communications system, comprising:

setting a variable gain device, which varies a power level of said broadband signal output from said transmitter, at two known setpoints;

measuring a corresponding output power level from said transmitter at each setpoint;

calculating a slope (SLP) of the detector based on the measured output power level at each setpoint;

selecting a predefined gain bands as a reference gain band;

measuring a power level at a frequency point inside the selected reference gain band;

adjusting the variable gain device until a desired reference output power level (DRPL) of the selected reference gain band is achieved;

determining a setpoint of the variable gain device at which DRPL is achieved in the selected reference gain band (REFVGD);

determining a desired operating output power level (OPL) for the transmitter in a desired gain band of operation based on frequency of operation, REFVGD, and the slope of the detector (SLP); and adjusting the variable gain device to provide said desired OPL.

2. A method in accordance with claim 1, wherein:

DRPL comprises a maximum operating power output level of the selected reference gain band.

3. A method in accordance with claim 2, further comprising:

determining a setpoint of the variable gain device for maximum power in the desired operating gain band MAXOPBANDVGD based on REFVGD;

wherein said desired OPL is further based on MAXOPBANDVGD.

4. A method in accordance with claim 3, wherein:

MAXOPBANDVGD is determined based on the desired gain band of operation, REFVGD, and the slope of the detector (SLP).

5. A method in accordance with claim 4, wherein:

MAXOPBANDVGD=REFVGD+(REFDELTA/SLP); and

REFDELTA is equal to the difference in gain between the desired operating gain band and the selected reference gain band.

6. A method in accordance with claim 3, wherein said adjusting step comprises:

determining a setpoint of the variable gain device at the desired OPL of the transmitter (SETVGD) and setting the variable gain device at SETVGD.

7. A method in accordance with claim 6, wherein:

SETVGD=MAXOPBANDVGD−[(DRPL-OPL)/ (SLP)]; and

SETVGD is used in a closed loop to set and maintain the desired power output level.

8. A method in accordance with claim 1, wherein:

the detector comprises a linear power detector.

9. A method in accordance with claim 1, wherein:

said broadband signal comprises one of an RF signal or microwave signal.

10. A method in accordance with claim 1, wherein:

said variable gain device comprises one of an analog attenuator, a digital attenuator, or an analog/digital variable gain amplifier.

11. Apparatus for calibrating a transmitter and setting output power levels of a broadband signal in a broadband communications system, comprising:

a variable gain device for varying a power level of said broadband signal output from said transmitter;

a detector for detecting the output power level of said transmitter;

a processor in communication with said detector and said variable gain device;

wherein:

the variable gain device is set at two known setpoints;

a corresponding power output level at each setpoint is measured;

the processor calculates a slope (SLP) of the detector based on the measured power ouput level at each setpoint;

the processor selects a predefined gain bands as a reference gain band;

a power output level at a frequency point inside the selected reference gain band is measured;

the processor adjusts the variable gain device until a desired reference output power level (DRPL) of the selected reference gain band is achieved;

the processor determines a setpoint of the variable gain device at which DRPL is achieved in the selected reference gain band (REFVGD);

the processor determines a desired operating output power level (OPL) in a desired gain band of operation based on frequency of operation, REFVGD, and the slope of the detector (SLP); and the processor adjusts the variable gain device to provide said desired OPL.

12. Apparatus in accordance with claim 11, wherein:

DRPL comprises a maximum operating power output level of the selected reference gain band.

13. Apparatus in accordance with claim 11, wherein:

a setpoint of the variable gain device is determined for maximum power in the desired operating gain band MAXOPBANDVGD based on REFVGD; and said desired OPL is further based on MAXOPBANDVGD.

14. Apparatus in accordance with claim 13, wherein;

MAXOPBANDVGD is determined based on the desired gain band of operation, REFVGD, and the slope of the detector (SLP).

15. Apparatus in accordance with claim 14, wherein:

MAXOPBANDVGD=REFVGD+(REFDELTA/SLP); and

REFDELTA is equal to the difference in gain between the desired operating gain band and the selected reference gain band.

16. Apparatus in accordance with claim 13, wherein:

said processor adjusts the variable gain device by determining a setpoint of the variable gain device at the desired OPL of the transmitter (SETVGD) and setting the variable gain device at SETVGD.

17. Apparatus in accordance with claim 16, wherein:

SETVGD=MAXOPBANDVGD−[(DRPL−OPL)/(SLP)]; and

SETVGD is used in a closed loop to set and maintain the desired power output level.

* * * * *